United States Patent [19]
Johansson et al.

[11] 4,075,683
[45] Feb. 21, 1978

[54] RACK FOR CIRCUIT BOARDS

[75] Inventors: Åke Ernst Elof Johansson, Bandhagen; Lars Christer Pahlén, Varby, both of Sweden

[73] Assignee: Telefonaktiebolaget L M Ericsson, Stockholm, Sweden

[21] Appl. No.: 718,185

[22] Filed: Aug. 27, 1976

[30] Foreign Application Priority Data

Sept. 5, 1975 Sweden .............................. 7509891

[51] Int. Cl.² .............................................. H02B 1/02
[52] U.S. Cl. ...................................... 361/415; 211/41
[58] Field of Search .......................... 361/415; 211/41; 339/65, 17 LM

[56] References Cited

U.S. PATENT DOCUMENTS

| | | | |
|---|---|---|---|
| 3,197,731 | 7/1965 | Beale et al. | 211/41 |
| 3,675,299 | 7/1972 | Sherrill, Jr. | 361/415 |
| 3,711,814 | 1/1973 | Pomella et al. | 361/415 |

Primary Examiner—David Smith, Jr.
Attorney, Agent, or Firm—Hane, Roberts, Spiecens & Cohen

[57] ABSTRACT

A rack for the parallel arrangement of a number of circuit boards provided with electronic components and the connecting electric wiring and a first part of a contact device has a front and a rear pair of mutually parallel profile bars attached between and perpendicular to two end plates with the second parts of the contact devices arranged between the rear pair of bars. In order to guide the first part of the contact device towards the second part when sliding the circuit boards into the rack, a guide moulding is provided for each profile bar with the moulding having transverse guide grooves and being insertable in a groove from the ends of the respective profile bar which is longitudinally fixed between the end plates when these are mounted.

2 Claims, 3 Drawing Figures

RACK FOR CIRCUIT BOARDS

The present invention relates to a rack for the parallel arrangement of a number of circuit boards provided with electronic components and the connecting electric wiring and a first part of a contact device. The rack has a front and a rear pair of mutually parallel profile bars attached between and perpendicularly to two end plates. Furthermore, between the rear pair of profile bars and perpendicular to the pair of bars there are arranged a number of second parts of the contact device corresponding to the number of circuit boards. Guide members are provided on the profiled bars in order to guide the first part of the contact device towards the second part when sliding the circuit boards into the rack.

It is well-known for larger electronic equipment as, for example, computers and information transmission equipment to functionally arrange related equipment in smaller, more manageable subunits. From many points of view this is desirable but mostly from the point of view of maintenance. Thus the subunits can be designed as for example mountings or racks into which can be plugged a number of smaller system parts built on circuits boards which are provided with contact. The racks are in their turn then assembled in a frame structure. The electric connections between the electronic components on such a circuit board are usually realized by means of a so-called printed circuit on the board. Connections between circuit boards in the same rack as well as connections with other system parts outside the rack are realized via a part of a contact device arranged at one edge at the circuit board and a corresponding part of the contact device in the rear part or the bottom of the rack. When sliding the board into the rack, the board is guided by means of special arrangements in order to bring together the two corresponding parts of the contact device.

On the different circuit boards are mounted electronic components as for example resistors, capacitors or relays with different physical dimensions therefore, the circuit boards in the rack must be arrangeable at different distances from each other.

A rack, which in principle consists of two end plates having attached between them two pairs of mutually parallel profile bars, is shown in the German patent application as published for opposition, 1,250,903. In this rack, a number of different guide members in the form of angle bars or U-girders can be mounted the members extending between the two lower and the two upper profile bars respectively. The guide members can, by means of screws and a clamp arrangement, be fixed in arbitrary positions along the profile bars.

Thus, to adjust and to fasten the many guide members which are needed in only one rack one must perform considerable work requiring a lot of time. An object of the present invention is to provide a rack which requires considerably less time for the assembly work and which is accordingly less expensive.

The gist of the invention is that the guide members have a guide moulding per profile bar, which moulding is provided with transverse guide grooves for the circuit boards. Furthermore, the guide moulding is insertable in a groove from the ends of the respective profile bar and is fixed longitudinally between the end plates when these are mounted.

The invention will be more fully described by means of an embodiment shown in the accompanying drawing wherein FIG. 1 shows a rack according to known technique;

Figure 1:
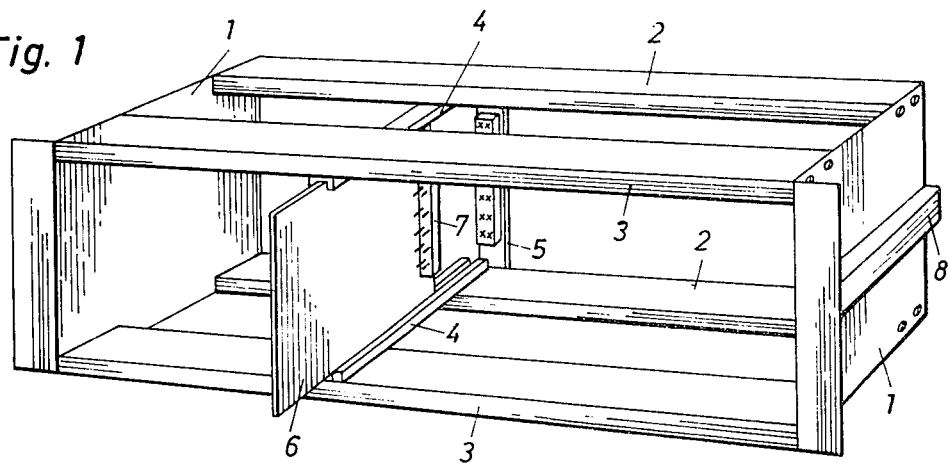

In FIG. 1 a rack according to known technique is shown. Two pairs 3,3 and 2,2 respectively of profile bars are attached by screws between two end plates 1,1. One of several pairs of guide members 4,4 arranged between the upper and the lower pair of profile bars respectively is also shown. A circuit board 6 with the associated first part 7 of a contact device is partly slid into a place in the rack. Between the rear pair of bars 2,2 second parts of a contact device 5 are attached, each co-operating with the first part of a contact device 7, one of which being shown. Bars 8 are arranged on the end plates 1 in order to support the rack when slid into a frame structure.

Figure 2:
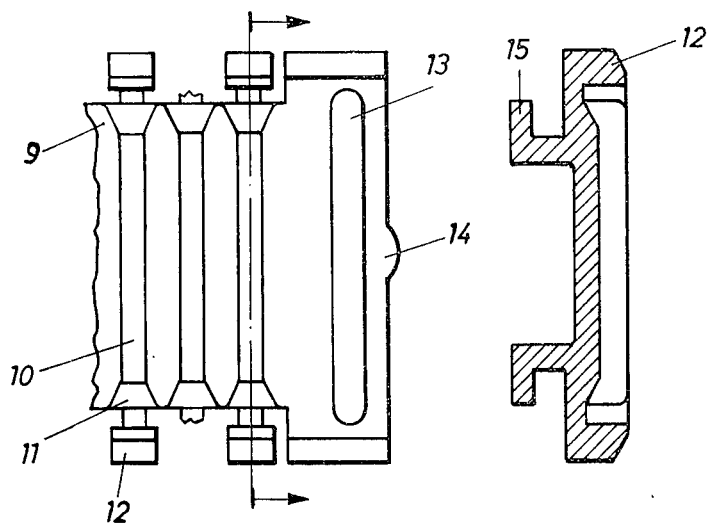
FIG. 2 shows a guide moulding according to the invention.

FIG. 2 shows an embodiment of the guide moulding 9 according to the invention. The moulding is at regular intervals provided with transverse guide grooves 10, the width of which is adapted according to the thickness of the circuit boards which are to be slid into the grooves. The grooves have, towards the edges of the moulding expanding mouths 11, each being blocked by a breakable knob 12. The knobs can, naturally, be broken off one-by-one by hand, but in large scale production of racks of the same type, this production step is best performed in a programmed tool. In FIG. 2 a groove is shown with the knobs broken off.

Close to one end of the moulding there is a transverse slot 13 and on the end surface of the moulding a somewhat projecting knob 14. When mounting the end plates of the rack, the knob 14 is pressed in and thereby deforming the slot 13 with accompanying spring effect. The guide moulding is pressed towards the opposite end plate and the longitudinal position of the moulding is unambiguously fixed.

Figure 3:
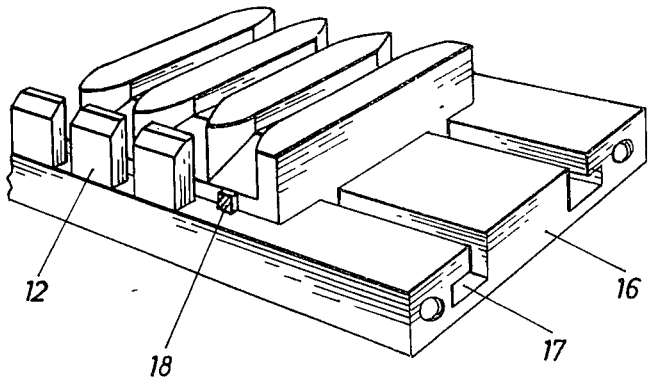
FIG. 3 shows a profile bar with a guide moulding.

From the above, it is apparent that all the guide mouldings suitably have their slots 13 turned in the same direction. In order to make possible the use of the same type of guide moulding in the lower as well as the upper profile bar the moulding is therefore equipped with breakable knobs along both long sides which knobs are broken off two-by-two for every guide groove. In FIG. 3 an embodiment of the guide moulding is shown with knobs 12 only at one longitudinal edge of the moulding. The guide mouldings for the rear pair of profile bars can of course completely lack blocking knobs 12. Furthermore, in FIG. 2 an embodiment of the flange 15 is shown which is slid into the corresponding groove 17 in the profile bar 16.

FIG. 3 shows a profile bar with an uncompletely inserted guide moulding and the remnants 18 of a broken knob in front of the first guide groove. The guide mouldings may suitably be injection moulded in a thermoplastic material ensuring good isolation between the rack and the electric wiring and components on the circuit boards.

We claim:

1. In a rack for the parallel arrangement of a number of circuit boards, each provided with electronic components and the associated electric wiring and a first part of a contact device, the rack including a front and a rear pair of mutually parallel profile bars attached between and perpendicular to two end plates, a corresponding number of second parts of the contact device arranged between the rear pair of profile bars and perpendicular to said pair of profile bars the improvement comprising guides mounted on each of said front profile bars for guiding the first part of a contact device towards the corresponding second part of the contact device when sliding the circuit boards into the rack, each of said guides comprising a guide moulding provided with transverse guide grooves for the circuit boards, and knobs blocking the mouth of at least some of the guide grooves, said knobs being selectively breakable to permit entry of the circuit boards into the corresponding grooves.

2. In a rack for the parallel arrangement of a number of circuit boards, each provided with electronic components and the associated electric wiring and a first part of a contact device, the rack including a front and a rear pair of mutually parallel profile bars attached between and perpendicular to two end plates, a corresponding number of second parts of the contact device being arranged between the rear pair of profile bars and perpendicularly to said pair of profile bars the improvement comprising guides mounted on some of the profile bars for guiding the first part of the contact device towards the corresponding second part when sliding the circuit boards into the rack, longitudinally extending grooves in said some profile bars, a guide moulding inserted in each of said longitudinally extending grooves, said guide moulding being provided with transverse guide grooves for receiving the circuit boards, a transverse slot adjacent one end of said guide mouldings, and a projecting knob at said one end so that during the mounting of the end plates said slot is elastically deformed thereby pressing the opposite end of the guide moulding against the opposite end plate whereby the longitudinal position of the guide moulding is unambiguously fixed.

* * * * *